SEMICONDUCTOR PREPARATION AND DEPOSITION PROCESS

Filed Oct. 11, 1967 2 Sheets-Sheet 1

INVENTORS

MELVIN BERKENBLIT
ARNOLD REISMAN

BY

ATTORNEY

SEMICONDUCTOR PREPARATION AND DEPOSITION PROCESS

Filed Oct. 11, 1967

2 Sheets-Sheet 2

United States Patent Office 3,577,286
Patented May 4, 1971

3,577,286
SEMICONDUCTOR PREPARATION AND DEPOSITION PROCESS

Melvin Berkenblit and Arnold Reisman, Yorktown Heights, N.Y., assignors to International Business Machines Corporation, Armonk, N.Y.

Filed Oct. 11, 1967, Ser. No. 674,471
Int. Cl. H01l 7/36, 7/00; C23c 11/00
U.S. Cl. 148—175 6 Claims

ABSTRACT OF THE DISCLOSURE

A process which includes the preparation of a substrate and subsequent epitaxial deposition of germanium on the substrate is described. Preparation of the substrate, either germanium or gallium arsenide, includes a chemical treatment step to remove surface films, rapid quenching, rinsing and drying steps, and a heating step prior to deposition. Deposition of germanium is carried out in an open tube disproportionation system, by introducing a germanium halide specie which is capable of disproportionating at a deposition site in concentrations and at velocities such that the deposition of germanium tends to be surface limited rather than mass transport limited. The deposition, preferably carried out on a (110) oriented substrate, is epitaxial, smooth and shiny and is suitable for subsequent processing requiring photographic techniques.

BACKGROUND OF THE INVENTION

Field of the invention

This invention relates generally to methods for epitaxially depositing a semiconductor on substrates. More specifically, it relates to a method for epitaxially depositing mirror smooth and shiny germanium in a low temperature disproportionation reaction from a germanium halide specie which is capable of disproportionating under conditions of germanium halide concentration and flow velocities which cause deposition to tend to be surface limited rather than mass transport limited, and to the preparation of substrates on which germanium is to be deposited.

DESCRIPTION OF THE PRIOR ART

Epitaxial deposition of germanium via disproportionation reactions both from a high temperature source to a low temperature deposition site and from a low temperature source to a high temperature deposition site have been known for a number of years. More recently, the literature has described the epitaxial deposition of germanium in open tube systems wherein the deposition of germanium at a deposition site is controlled by introducing hydrogen or hydrogen and an inert gas in given mole fractions at the germanium source. Other recent literature has described a technique for enhancing the efficiency of deposition of germanium by introducing excess hydrogen or hydrogen and an inert gas in given mole fractions at the deposition site. In addition, the recent literature has described a technique in the open tube regime which allows the pyrolytic decomposition of a dopant compound simultaneously with the deposition of germanium from a germanium halide specie without affecting the efficiency of deposition of the germanium. These teachings have been covered in the following issued patents which are assigned to the same assignee as the present invention:

U.S. Pat. No. 3,345,223, entitled "Epitaxial Deposition of Semiconductor Materials," issued on Oct. 3, 1967, in the names of Arnold Reisman, Melvin Berkenblit, Satenik A. Papazian, and George Cheroff describes the epitaxial deposition of germanium in an open tube system wherein the deposition of germanium is controlled by the introduction of inert gas or hydrogen and an inert gas at the germanium source.

U.S. Pat No. 3,354,004 entitled "Method for Enhancing Efficiency of Recovery of Semiconductor Material in Perturbable Disproportionation Systems," issued Nov. 21, 1967, in the names of Arnold Reisman, Melvin Berkenblit, and Satenik A. Alyanakyan describes the enhancement of efficiency of deposition of germanium in an open tube system from a germanium halide specie by introducing excess hydrogen or hydrogen and an inert gas at the deposition site.

U.S. Pat. No. 3,361,600 entitled "Method of Doping Epitaxially Grown Semiconductor Material," issued Jan. 2, 1968, in the names of Arnold Reisman and Melvin Berkenblit describes the simultaneous disproportionation of a germanium halide specie and the pyrolytic decomposition of a dopant compound without affecting the efficiency of deposition of germanium.

In all the above mentioned patents, the reactions involved, both at source and deposition site, have been carried out under conditions which tend toward equilibrium conditions. Conditions of germanium halide concentration and velocity are such that the deposition of germanium tends to be mass transport limited, that is, the amount of germanium deposited is a function of the amount of germanium delivered to the deposition site.

While the techniques described in the above mentioned patents provided a large degree of control in the open tube low temperature disproportionation system, the quality of germanium deposits when compared with prior art high temperature processes such as the hydrogen reduction of $GeCl_4$ on Ge substrates left something to be desired and all the advantages resulting from the ability to deposit germanium at relatively low temperatures could not be realized. The present invention does, however, permit such advantages to be realized and provides smooth, shiny surfaces with deposition being carried out at rates comparable to the higher temperature prior art processes.

SUMMARY OF THE INVENTION

The method of the present invention, in its broadest aspect, comprises the step of introducing a germanium halide compound in the vapor phase which is capable of disproportionating at a deposition site under conditions of flow and concentration of the germanium halide such that the amount of germanium deposited tends to be surface limited. The method in its broadest aspect, also includes a step of preparing the surface of a previously polished semiconductor substrate, or wafer prior to deposition, to remove deleterious surface conditions and to prevent the occurrence of conditions at the surface which lead to the production of poor surfaces upon deposition.

In accordance with more particular aspects of the invention, a gallium arsenide or germanium substrate which has been previously polished is subjected to preparation steps which include: chemically treating the surface of the substrate by immersing it in an appropriate solubilizer for a time sufficient to remove accumulated surface contaminants; quenching the chemical action rapidly, rinsing the substrate while immersed in deionized water; drying the substrate in a stream of inert gas; introducing the substrate into the disproportionation system and disposing it face downward therein, heating the substrate in hydrogen to achieve a final cleaning and depositing germanium from a disproportionatable germanium halide species under conditions of velocity and germanium halide concentration which cause deposition of germanium to tend to be surface limited rather than mass transport limited. The resulting deposition is mirror smooth and shiny and is suitable for further processing including the use of photolithographic techniques during the fabrication of semiconductor devices, some of the parts of which have dimensions of approximately one micron.

It is, therefore, an object of this invention to provide a method for depositing germanium epitaxially under conditions of germanium halide concentration and linear gas stream velocity such that the deposition of germanium is essentially surface limited.

Another object is to provide mirror smooth and shiny surfaces of epitaxially deposited germanium on (110) oriented substrates of germanium or gallium arsenide.

Still another object is to provide epitaxially deposited germanium having surfaces which are comparable to those obtained using higher temperature prior art techniques.

Yet another object is to provide a method for epitaxially depositing germanium at rates comparable to those obtainable using higher temperature processes.

Another object is to provide a method of substrate preparation which insures the formation of smooth, shiny, epitaxial germanium films which are suitable for further processing in the manufacture of integrated circuits.

The foregoing and other objects, features and advantages of the invention will be apparent from the following more particular description of a preferred embodiment of the invention as illustrated in the accompanying drawings.

DESCRIPTION OF THE PREFERRED EMBODIMENT

Figure 1:
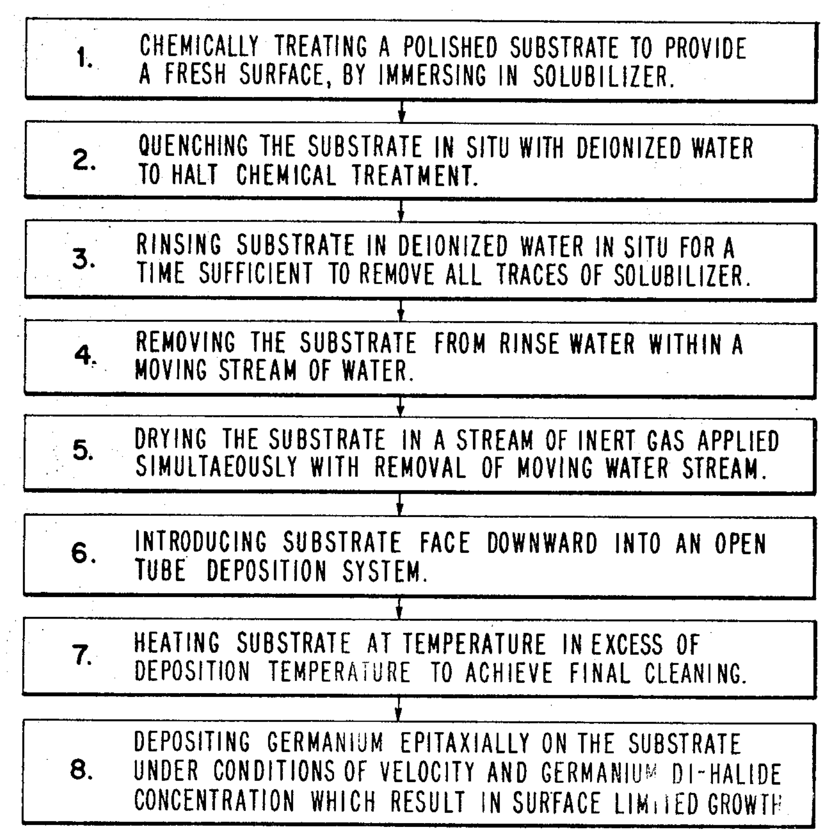
FIG. 1 is a flow chart diagrammatically outlining the steps utilized in practicing the method of the present invention.

Before addressing the preferred method of the present invention reference should be made to the U.S. Pat. No. 3,345,223, entitled "Epitaxial Deposition of Semiconductor Materials," issued on Oct. 3, 1967, mentioned hereinabove which discloses a method for depositing germanium from a perturbable germanium halide species by introducing mixtures of hydrogen and an inert gas or an inert gas alone at a germanium source during the formation of the germanium halide to provide variations in the efficiency of germanium pick up and consequently in the efficiency of germanium deposition. Briefly, it was found that when different mole fractions of hydrogen and helium are provided at a given temperature at a germanium source along with a halogen or a halogen in halide form, it is possible to adjust the conditions of germanium pick-up and deposition so that maximum efficiency can be attained for the particular conditions chosen. The mole fraction of hydrogen and helium, specifically the ratio $$F=\frac{H_2}{(H_2+He)}$$

encompasses the conditions where pure hydrogen, pure helium and all ratios between these conditions are utilized. In open tube systems of the type shown, the amount of germanium deposited is proportional to the amount picked up at the source bed, so changing conditions at the source by the introduction of different hydrogen-helium fractions changes the conditions at the deposition site. The effect of adding more helium at a germanium source bed is that conditions for the hydrogen halide remaining in the vapor phase are disturbed. As a result, the greater the quantity of helium introduced, the more germanium halide, germanium di-iodide, for example, is formed. The more di-iodide formed, the more will be deposited on the substrate at a deposition site when the germanium di-iodide disproportionates to pure germanium and germanium tetra-iodide at a lower temperature than the germanium source temperature. Where hydrogen is a constituent of the mixture, the partial pressure of hydrogen must at least be equal to the partial pressure of the halogen present. From the foregoing, it should be clear that equilibrium conditions are being maintained or closely approached at both source and deposition site. At the source, the velocity and concentration of the halogen are adjusted so that all the germanium which can be picked up is picked up, subject to control by the amount of helium introduced. At the deposition site, the germanium halide species disproportionates at a lower temperature and all the germanium which can be deposited is deposited because equilibrium conditions for the reaction $$2GeI_{2(v)} \rightleftarrows Ge_{(s)} + GeI_{(v)}$$

are maintained or approached. Deposition of germanium of this character is said to be mass transport limited.

In the present invention, conditions of linear gas stream velocity and halogen or halide concentration at the source are adjusted such that equilibrium conditions are attained; that is, all the germanium which can be picked up is picked up. Thus, a disproportionatable di-halide species is formed, the amount of the di-halide being controlled by the addition of helium to the hydrogen already present. At the deposition site, the di-halide species encounters a lower temperature, but because of the rate at which the di-halide species is introduced and, because the residency time of the vapor at the substrate is not sufficiently long, equilibrium conditions are not attained. Nevertheless, deposition of germanium takes place, and contrary to what might be expected from studies of systems which use low velocities and low iodine vapor pressures and which are consistent with transpiration studies and thermodynamic analysis of such systems, the present system using relatively high velocities and iodine vapor pressures, produces surface qualities which are markedly enhanced over those obtained by the low velocity and iodine vapor pressure system. A system wherein equilibrium conditions are not approached at the deposition site because of high velocities and low residency time of the vapor in the region of the substrate but, where deposition takes place, is a system wherein the deposition of germanium may be characterized as surface limited.

The point to be appreciated from the foregoing is that while certain similarities exist between the present invention and that taught in the above mentioned patent, the conditions at deposition site are quite different and unexpectedly provide, under low temperature deposition conditions, germanium deposits which are comparable in rate of deposition and surface quality to depositions obtained by prior art high temperature techniques.

Referring now to FIG. 1, in accordance with preferred method steps as outlined therein in flow chart form, a mirror smooth, shiny, epitaxial film is deposited on a substrate as follows:

*Step 1.*—Chemically treating a polished substrate to provide a fresh surface.

A substrate of germanium or gallium arsenside which has been previously subjected to a polishing treatment is utilized for this step. Depending on the conductivity type, resistivity and orientation of the substrate, a chemical polishing or electro-polishing technique may be utilized to provide an acceptable surface. Substrates which have been subjected to a chemical polishing technique described in U.S. Pat. No. 3,342,652, entitled "Chemical Polishing of a Semiconductor Substrate" in the names of A. Reisman et al. issued, Sept. 19, 1967 and assigned to the same assignee as the present invention are preferably used in the practice of the present invention.

Figure 2:
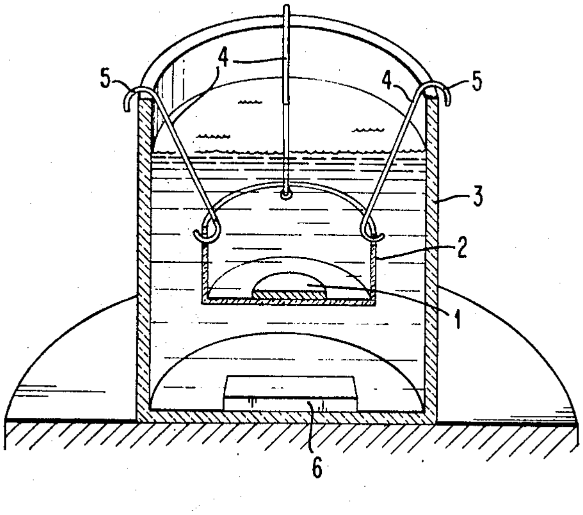
FIG. 2 is a cross-sectional perspective view of a beaker-hanging basket arrangement utilized in the chemical treatment and rinsing of substrates during their preparation prior to deposition.

In carrying out the chemical treating of the substrate, which retains the original surface texture and planarity, a substrate of germanium or gallium arsenide is immersed in an appropriate solubilizer in the beaker-hanging basket arrangement of FIG. 2. A substrate 1 is placed in a cylindrical basket 2 which is made of glass or other material which is unaffected by the solubilizers used and disposed within a beaker 3 spaced from the bottom of beaker 3 by rods 4 which are attached to the basket at one end thereof and overhang the rim of beaker 3 by means of hook-like portion 5 at the other end thereof. Basket 2 is immersed beneath the surface of the solubilizer which is either ultrasonically agitated or stirred by magnet 6 disposed at the bottom of beaker 3 for that purpose. Magnet 6 is rotated by another magnet (not shown) which is rotatably driven by a motor or the like.

Using a gallium arsenide substrate, the substrate is placed in basket 2, and immersed in a solution of $90H_2SO_4:5H_2O_2:5H_2O$ for 5 minutes. The solution is magnetically stirred during the chemical treating period.

Using a germanium substrate, a satisfactory cleaning action can be obtained by immersing the substrate in basket 2 in a 3:1 solution of $H_2O:NaOCl$ stock solution (5% available chlorine) for 90 seconds with the solution being ultrasonically agitated by means of an ultrasonic transducer (not shown) during the chemical treating period.

As a result of the above step, any residues which may have remained on the surface after initially polishing the substrates are removed and the substrate should have a surface which is suitable for epitaxial deposition. However, simply removing the substrate from the solution has not been found to provide surfaces which result in mirror smooth, shiny epitaxial deposits. The substrate at the end of the chemical treatment period must be further treated.

*Step 2.*—Quenching the chemical action on the substrate in situ (while the substrate is still in basket 2 and immersed therein in the solubilizing solution) by immersing basket 2 in a beaker of deionized water to halt the chemical action on the substrate.

*Step 3.*—Rinsing the substrate in situ in deionized water for a time sufficient to remove all traces of the solubilizer.

This step is accomplished by directing a stream of deionized water at the substrate for approximately five minutes; all the while maintaining the substrate immersed in the water which overflows the sides of the beaker of deionized water.

*Step 4.*—Removing the substrate from the rinse water within a moving stream of water preparatory to drying so that the substrate is substantially immersed during removal.

This step is accomplished by grasping the substrate with a forceps or the like and removing it from basket 2. During removal, the substrate is held within the moving stream of deionized water so that it is, in effect, still immersed in water.

*Step 5.*—Drying the substrate in a stream of inert gas which is applied simultaneously with the removal of the moving water streams.

This step is accomplished by quickly transferring the substrate from the moving water stream to a stream of nitrogen or other inert gas in such a way that the film of water held to the surface of the substrate by surface tension is blown off the substrate as a single droplet of water rather than as a number of smaller droplets which would tend to evaporate from the substrate. This drying is, therefore, accomplished by physical removal of the water with a minimum of evaporation. Where evaporation is allowed to take place a haze or cloudy residue is left on the surface of the substrate. After deposition of germanium on the surface, the hazy areas have poorer surface qualities than the areas which are not hazy. The removal of the water can be best accomplished by applying the stream of inert gas at a low angle relative to the surface of the substrate so that the gas stream pushes the water off without splashing.

*Step 6.*—Introducing the substrate face downward in an open tube disproportionation system.

Figure 3:
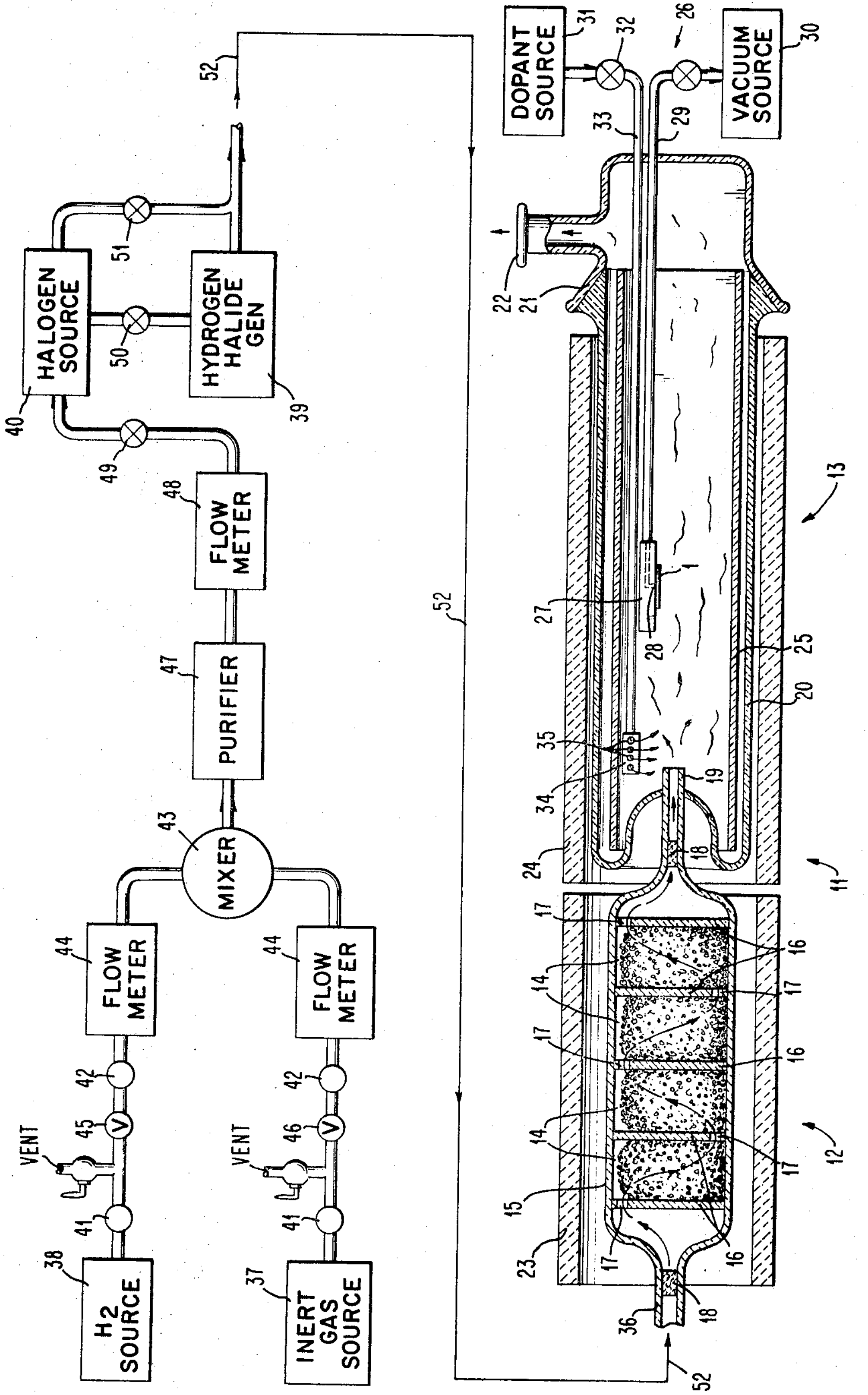
FIG. 3 is a partial block diagram cross-sectional view of apparatus utilized in performing the method of the present invention.

The substrate is attached to a vacuum chuck or other suitable mounting and disposed downwardly within the deposition system shown in FIG. 3. This step is taken to protect the surface upon which deposition is to be made at the deposition site. Epitaxial films are subject to large spurious overgrowths or "spikes" which result from the nucleation of germanium about particles which flake off from the walls of the reaction tube in which deposition takes place. Spikes, 20–30 microns high, have been observed on upwardly facing substrates having 5–10 microns thick films of germanium deposited thereon. This dusting problem was substantially eliminated by disposing the substrates face downwardly within the deposition site. The vacuum chuck arrangement will be explained in more detail when the system of FIG. 3 is explained in what follows.

*Step 7.*—Heating the substrate at temperatures in excess of the deposition temperature to achieve final cleaning.

This step is accomplished in the deposition system of FIG. 3 by heating the deposition site which contains the substrate to temperatures of 600° C. and 700° C. for gallium arsenide and germanium, respectively, in a reducing gas such as hydrogen for thirty minutes immediately prior to epitaxy.

*Step 8.*—Depositing germanium epitaxially on the substrate under conditions of velocity and germanium dihalide concentration which result in essentially surface limited growth.

Referring now to FIG. 3, there is shown a partial block diagram cross-sectional view of the apparatus utilized in carrying out the deposition step of this method. An open tube disproportionation system is shown generally at 11, consisting of a germanium source bed 12 and a seed or deposition site 13. Germanium source bed 12 consists of pieces of crushed or pelletized germanium through which a desired gas or vapor may be passed. The crushed germanium is disposed within a plurality of chambers 14 which are formed within a quartz tube 15 by spaced apart quartz plates 16. Each of the quartz plates 16 has an aperture 17 disposed therein to permit inflowing gas or vapor to pass from one chamber to the next. Apertures 17 are disposed in staggered relationship in quartz plates 16 to cause the incoming gas or vapor to pass in serpentine fashion, as shown by the arrows passing through aperture 17 in FIG. 3, through germanium source bed 12. In this manner, under the conditions of high velocity and halogen or halide concentration which will be discussed more fully in what follows, equilibrium is achieved between the germanium source bed 12 and the disproportionatable germanium halide specie. In other words, a path through the germanium is set up which permits saturation of the incoming gas, which includes a halogen or a hydrogen halide, with germanium. Source bed 12 as shown in FIG. 3, is illustrative. In reality, a greater number of germanium filled chambers 14 are present to insure the saturation of the incoming gas with germanium.

The crushed germanium is retained in quartz tube 15 by quartz wool plugs 18. Quartz tube 15 at the right hand end thereof terminates in a necked-down nozzle portion 19 which is receivable in quartz tube 20 which is an element of deposition site 13. Quartz tube 20 is closed by a removable section 21 which has an exhaust port 22 disposed therein for the removal of residual gases. Quartz tubes 15, 20 are surrounded by furnaces 23, 24 respectively, which provide desired temperatures at source bed 12 and deposition site 13. The furnaces may be of any suitable type well known to those skilled in the deposition art. The temperatures desired may be controlled by thermocouples (not shown) which in conjunction with well-known circuit arrangements hold the furnaces at desired temperature values. A quartz liner tube 25 is shown in slidably engaging relationship with quartz tube 20. Liner tube 25 is utilized to facilitate cleaning of the system and is of such diameter that under the conditions of flow of vapor in deposition site 13 desired high velocities are attained.

A substrate 1 is shown positioned within deposition site 13 and inside of liner tube 25 by means of vacuum chuck 26. Vacuum chuck 26 consists of a substrate holder 27 which is made from a semi-cylindrical quartz tube having an aperture 28 disposed in the flat face of holder 27. The aperture 28 is 25 mils in diameter and a vacuum is applied to the aperture through quartz tubulation 29 which also acts as a support for holder 27. A vacuum pump 30 is connected to tubulation 29 and may be any suitable type well known to those skilled in the vacuum art. To insure retention of substrate 1 on the flat face of substrate holder 27, the flat face is lapped smooth during fabrication. The back surface of substrate 1 is also lapped to make certain close contact is attained between substrate 1 and the flat face of substrate holder 27.

If doping of the epitaxially deposited germanium is desired, a suitable dopant, either p or n-type, well known to those skilled in the deposition art, may be introduced from dopant source 31, via valve 32 and tubulation 33 to an output tube 34 which contains a plurality of orifices 35. Output tube 34 is disposed adjacent nozzle portion 19 to insure thorough mixing of the dopant gas with the germanium halide containing gas from nozzle 19. Orifices 35 serve to diffuse the dopant gas and further insure mixing with the gas from nozzle 19. Output tube 34 and tubulation 33 may be made of quartz or any other suitable heat resistant material.

The gases utilized in the performance of the method of this invention are introduced into the left hand end of quartz tube 15 via a necked-down portion 36 from an inert gas source 37, a hydrogen source 38, a hydrogen halide generator 39 and a halogen source 40. High and low pressure regulators 41, 42, respectively, inserted in the flow line control the flow of gas to mixer 43 and flow meters 44 monitor the flow from gas sources 37 and 38. Inert gas source 37 may be a source of any inert gas such as argon or nitrogen, but in the preferred method of this invention helium is utilized. On-off valves 45, 46, are utilized in instances where one or the other of the gases hydrogen and helium is used alone. The gas or gases, as the case may be, pass through mixer 43 to purifier 47 where contaminants are removed. Flow meter 48 monitors the resulting flow which may pass through either halogen source 40 alone or pass to hydrogen halide generator 39 by the appropriate operation of on-off valves 49, 50, 51. The flow from either hydrogen halide generator 39 or halogen source 40 is then carried to germanium source bed 12 by way of tubulation 52 shown schematically in FIG. 3.

From a consideration of the apparatus of FIG. 3, it should be clear that it is possible to generate any gas combinations desired. In the instance where pure helium and iodine are required, the hydrogen source 38 and halide generator 39 are effectively removed from the system by closing on-off valves 45 and 50 respectively. In this arrangement, the iodine or other halogen introduced into system 11 at a given germanium source bed temperature, (600° C.) for instance, reacts with the germanium in source bed 12 to form a halide specie, $GeI_2$, for instance. After the reaction, the halide specie is transported to deposition site 13 where disproportionation at a lower temperature occurs resulting in the deposition of germanium on substrates 1. The remaining disproportionation product ($GeI_4$) is exhausted via exhaust port 22.

Mixtures of hydrogen and helium may also be introduced into system 1 along with either a pure halogen or with a hydrogen halide. The hydrogen halide form is preferable because it most easily satisfies the equilibrium conditions present at source bed 12 insuring the reaction of iodine and germanium stoichiometrically.

At germanium source bed 12, a mixture of hydrogen, helium and hydrogen iodide, for instance, is present having a total pressure of one atmosphere.

$$P\ \text{total}=760\ \text{mm.}=P_{HI}+P_{H_2}+P_{He}$$

At a source bed temperature of 600° C., for example, germanium di-iodide ($GeI_2$) is preferentially formed. The vapor pressure of the halogen or the hydrogen halide is adjusted by adjusting the temperature of the halogen in halogen source 40. At a given temperature a given vapor pressure of the halogen, iodine, for example, is generated. The amount of hydrogen halide formed by introducing hydrogen, is therefore dependent on the vapor pressure of iodine. The concentration of germanium iodide formed, in turn, depends on the concentration of the hydrogen halide subject to further control by dilution with helium. Thus, the germanium iodide concentration for any given value of helium may be defined by the concentration of the hydrogen halide. The di-iodide is then carried to deposition site 13 where pure germanium is deposited on substrate 1. By changing the hydrogen-helium fraction F, it is possible to obtain control over the amount of germanium picked up at source bed 12. However, because of the gas velocities and germanium halide concentrations utilized, the amount of germanium deposited is not mass transport limited but as indicated hereinabove, is approaching essentially surface limited conditions.

In operation, the following ranges of parameters may be utilized to achieve germanium growth or deposition wherein the growth approaches surface limiting conditions. The apparatus of FIG. 3 is utilized and the parameters relate to a hydrogen-helium-hydrogen iodide system with the substrate upon which germanium is to be deposited having a (110) orientation.

Germanium source bed temperature—550°–900° C.
Deposition site temperature—300°–500° C.
Iodine source temperature—>50°–90° C.
Equivalent hydrogen iodide pressure—>4–50.2 torr.

$$F=\frac{H_2}{(H_2+He)} \quad 0\text{–}1$$

Gas stream velocity—>50 cm./min.–>200 cm./min.
Substrate—Germanium or gallium arsenide.
Growth rate—1–20μ/hr.

Using a more specific example, after carrying out steps 1–7 as outlined hereinabove, a germanium substrate having a (110) orientation is prepared for deposition. Inert gas source 37 and hydrogen source 38 are adjusted to provide a hydrogen-helium fraction, $F=.15$. This represents a mixture of 85% helium and 15% hydrogen. The gases are mixed in mixer 43 and passed through halogen source 40 and hydrogen halide generator 39. The hydrogen iodide-helium mixture is passed through tubulation 52 at a flow rate of 915 cc./min. Tubulation 52 has a diameter of 25 mm. This flow rate is equivalent to a velocity of 190 cm./min. in a 1" diameter tube which is the diameter of liner tube 25. The velocity in the region of substrate 1 is, therefore, 190 cm./minute. The temperature of halogen source 40 is maintained at approximately 65° C. representing a hydrogen halide partial pressure of approximately 11.0 torr. Germanium source bed 12 is heated to a temperature of approximately 610° C. while deposition site 13 is heated to a temperature of approximately 350° C. Under the above mentioned conditions of high linear gas stream velocity and high germanium iodide concentration relative to velocities and concentrations used in mass transport limited systems mentioned hereinabove, deposition or growth of germanium takes place on substrate 1 at a rate of approximately 5μ/hour. The surface is mirror smooth and shiny and is suitable for use in extremely high resolution photolithographic techniques.

The range of velocities given hereinabove is a preferred range and, while deposition using the lower value of velocity (>50 cm./min.) tend to be poor, as the velocities are increased slightly, the surface of the deposited germanium becomes smooth and shiny and remains so until the upper value of velocity (>200 cm./min.). The values of velocity were limited as a practical matter by the apparatus used and there is no reason to believe that higher velocities (300 cm./min. and up)

could not be used. The same may be said of the germanium iodide concentration which has been disclosed herein as a preferred range of hydrogen iodide pressures.

It should be appreciated that the present technique is applicable under conditions where pure hydrogen or pure helium is utilized and that a pure halogen or a hydrogen halide may be used with substantially equal effect. While iodine has been referred to hereinabove by way of illustration, it should be appreciated that any of the halogens may be utilized to provide results similar to those obtained using iodine. There is no reason to believe that any of the other halogens will not conform to the trends demonstrated using iodine. It is, of course, understood that conditions at both the source bed and deposition site will be somewhat different and such differences must be taken into account.

In the course of experimentation, it was found that the best germanium deposits were obtained on substrate surfaces having a (110) orientation for both germanium and gallium arsenide. The results obtained indicated that the quality of the depositions were somewhat orientation sensitive. Apart from this, there is no reason to believe that high quality germanium depositions cannot be attained on substrates having other orientations than the (110). The point to be appreciated is that even though the parameters and conditions outlined hereinabove provide mirror smooth and shiny deposits on substrates having (110) orientations, it is also possible to obtain germanium depositions at growth rates comparable to those attained using higher temperature prior art processes on substrates having any orientation.

Referring again to FIG. 3, dopant source 31 is utilized to permit the addition of dopants such as boron or arsenic to the germanium deposited on the surface of substrate 1. Doping with boron is accomplished by providing a source of boron ($BI_3$) in source 31 and passing either helium or mixtures of hydrogen and helium through the boron source at room temperature. In this manner, concentrations of boron of 100–800 parts/million can be achieved. A boron tri-iodide containing mixture is passed via tubulation 33 to deposition site 13 where it mixes with the incoming vapor from nozzle portion 19. At the deposition site temperature, boron deposits along with the germanium. There is no decrease in surface quality with increasing $BI_3$ concentrations.

To dope germanium deposited on substrate 1 with arsenic, dopant source 31 may include a source of $AsH_3$ (arsine). This compound along with a carrier gas of helium or a mixture of hydrogen-helium is introduced into deposition site 13 via tubulation 33 where the $AsH_3$ decomposes and deposits as arsenic along with germanium on substrate 1. Boron is an acceptor impurity while arsenic is a donor impurity and can be obtained in the form of solid $BI_3$ and gaseous $AsH_3$, diluted with helium or mixtures of hydrogen and helium from commercial sources.

From the foregoing, it should be clear that it is possible to obtain depositions of germanium, both doped and undoped, on substrates of germanium and gallium arsenide at rates of growth which are comparable to those obtained using higher temperature processes. These growth rates are achieved under conditions of velocity and germanium halide concentration which cause growth to be essentially surface limited. There is, however, no reason why such deposition cannot be achieved on substrates of other semiconductor material such as silicon.

It should, however, be appreciated that where depositions of special quality are required such as the deposition of germanium on either germanium or gallium arsenide substrates having a (110) orientation, all the steps of the present method are required. Thus, the initial chemical treating step cannot be eliminated or a poor quality surface of deposited germanium will result. Also, if the substrates during preparation are not dried properly, a poor quality surface of deposited germanium will result.

Obviously, in any case, spurious nucleation due to dusting must be eliminated or a poor surface will result. Thus, if a high quality surface of deposited germanium is to be obtained, none of the steps of the present invention can be eliminated.

While the invention has been particularly described with reference to specific examples thereof, it will be understood by those skilled in the art that various changes in procedures may be made therein without departing from the spirit of the invention.

What is claimed is:

1. In a method for epitaxially depositing germanium films on a semiconductor substrate, the steps of:

generating a germanium halide compound in the vapor phase at a temperature in the range of 550–990° C., at a velocity in the range of 50–300 cm./min. and at a concentration in terms of the vapor pressure of a hydrogen halide in the range of 5.0–50.2 torr which is capable of disproportionating by reacting one of the substances selected from the group consisting of the halogens and the hydrogen halides with a germanium source bed to form a germanium halide compound which is in reactive equilibrium with said germanium source bed, introducing an inert gas to control the concentration of germanium halide formed in the vapor phase and, introducing said germanium halide compound in the vapor phase at a deposition site at said velocity and concentration and at a temperature in the range of 300–500° C. to cause epitaxial deposition on said substrate, the amount of germanium deposited being surface limited at said velocity and concentration.

2. In a method according to claim 1 further including the step of:

mixing a dopant in the vapor phase with said germanium halide in amounts sufficient to provide doped germanium films.

3. In a method according to claim 1 wherein said substrate is one selected from the group consisting of germanium and gallium arsenide, said germanium halide compound is germanium di-iodide, said halogen is iodine, said hydrogen halide is hydrogen iodide, and said inert gas is helium.

4. A method for obtaining smooth, shiny, epitaxial germanium films on a semiconductor substrate having a (110) orientation selected from the group consisting of germanium and gallium arsenide the steps of:

chemically treating said substrate to provide a fresh surface by immersing said substrate in a solubilizing solution said solution being a 3:1 solution of $$H_2O:NaOCl$$

for germanium and a solution of $$90H_2SO_4:5H_2O_2:5H_2O$$

for gallium arsenide, quenching the chemical treating by immersing said substrate which is immersed in said solubilizing solution in deionized water, rinsing said immersed substrate for five minutes in deionized water to remove all traces of said solubilizing solution, removing said substrate from said deionized water within a moving stream of water, drying said substrate in a stream of nitrogen applied simultaneously with the removal of said moving stream of water, introducing said substrate face downwardly into an open tube deposition system, heating said substrate in hydrogen for 30 minutes at a temperature of 700° C. for germanium and 600° C. for gallium arsenide, and introducing a germanium halide compound which is in reactive equilibrium with a source bed of germanium and formed from a hydrogen, helium, hydrogen halide mixture which is capable of disproportionating in the region of said substrate in the vapor phase at a velocity in the range of 50–300 cm./min. and in a concentration in terms of the vapor pressure of a hydrogen halide of 5.0 to 50.2 torr such that the amount of germanium deposited on said substrate tends to be surface limited.

5. A method according to claim 4 wherein said germanium halide compound is germanium diiodide.

6. A method according to claim 4 further including the step of:

mixing a dopant in the vapor phase with said germanium halides in amounts sufficient to provide doped germanium films.

References Cited

UNITED STATES PATENTS

| | | | |
|---|---|---|---|
| 2,910,394 | 10/1959 | Scott et al. | 148—1.5 |
| 3,021,198 | 2/1962 | Rummel | 148—175UX |
| 3,082,136 | 3/1963 | Finn | 156—17 |
| 3,088,888 | 5/1963 | Leff | 156—17X |
| 3,089,788 | 5/1963 | Marinace | 148—175X |
| 3,173,814 | 3/1965 | Law | 148—175 |
| 3,194,703 | 7/1965 | Bloem | 156—17 |
| 3,208,888 | 9/1965 | Ziegler et al. | 148—175 |
| 3,212,939 | 10/1965 | Davis | 156—17X |
| 3,260,624 | 7/1966 | Wiesner | 148—175 |
| 3,297,501 | 1/1967 | Reisman | 148—175 |
| 3,310,425 | 3/1967 | Goldsmith | 117—106 |
| 3,342,652 | 9/1967 | Reisman et al. | 156—17 |
| 3,345,223 | 10/1967 | Reisman et al. | 148—175 |
| 3,354,004 | 11/1967 | Reisman et al. | 148—175 |
| 3,361,600 | 1/1968 | Reisman et al. | 148—175 |
| 3,366,520 | 1/1968 | Berkenblit et al. | 148—175 |
| 3,393,103 | 7/1968 | Heubardt et al. | 148—175 |

OTHER REFERENCES

Holmes, P. J.: "Electrochemistry of Semiconductors," pp. 329–377, Academic Press, London and New York, 1962.

Many, A., et al.: "Semiconductor Surfaces," chapter 3, pp. 90–127, Wiley & Sons Inc., New York, 1965.

L. DEWAYNE RUTLEDGE, Primary Examiner

W. G. SABA, Assistant Examiner

U.S. Cl. X.R.

117—106, 107.2; 148—1.5; 156—17